United States Patent
Brunnbauer et al.

(10) Patent No.: US 7,952,188 B2
(45) Date of Patent: May 31, 2011

(54) SEMICONDUCTOR MODULE WITH A DIELECTRIC LAYER INCLUDING A FLUOROCARBON COMPOUND ON A CHIP

(75) Inventors: Markus Brunnbauer, Lappersdorf (DE); Joachim Mahler, Regensburg (DE); Manfred Mengel, Bad Abbach (DE)

(73) Assignee: Infineon Technologies AG, Munich (DE)

( * ) Notice: Subject to any disclaimer, the term of this patent is extended or adjusted under 35 U.S.C. 154(b) by 1089 days.

(21) Appl. No.: 11/650,872

(22) Filed: Jan. 8, 2007

(65) Prior Publication Data

US 2008/0164599 A1 Jul. 10, 2008

(51) Int. Cl.
*H01L 23/12* (2006.01)
*H01L 21/4763* (2006.01)
(52) U.S. Cl. .......................... 257/701; 257/759; 438/623
(58) Field of Classification Search .................. None
See application file for complete search history.

(56) References Cited

U.S. PATENT DOCUMENTS

| | | |
|---|---|---|
| 5,798,563 A | 8/1998 | Feilchenfeld et al. |
| 6,028,364 A | 2/2000 | Ogino et al. |
| 6,391,422 B1 * | 5/2002 | Mori et al. .................. 428/131 |
| 6,756,662 B2 * | 6/2004 | Infantolino et al. .......... 257/680 |
| 6,773,958 B1 | 8/2004 | Wang |
| 6,967,389 B2 * | 11/2005 | Infantolino et al. .......... 257/642 |
| 2002/0088707 A1 | 7/2002 | Towle |
| 2003/0113995 A1 | 6/2003 | Xia et al. |
| 2003/0155145 A1 * | 8/2003 | Ou et al. ...................... 174/52.1 |
| 2004/0058474 A1 * | 3/2004 | Infantolino et al. .......... 438/108 |
| 2005/0266668 A1 * | 12/2005 | Sawada et al. ................ 438/612 |
| 2006/0087037 A1 | 4/2006 | Hsu |
| 2007/0048903 A1 * | 3/2007 | Komiyama et al. .......... 438/108 |
| 2008/0142963 A1 * | 6/2008 | Venegas et al. ............... 257/732 |

FOREIGN PATENT DOCUMENTS

| | | |
|---|---|---|
| DE | 203 03 492 U1 | 5/2003 |
| DE | 101 57 280 A1 | 6/2003 |
| DE | 102 53 855 A1 | 6/2004 |

OTHER PUBLICATIONS

Brunnbauer et al., "Embedded Wafer Level Ball Grid Array (eWLB)," 2006 Electronics Packaging Technology Conference, pp. 1-5.

* cited by examiner

*Primary Examiner* — Alonzo Chambliss
(74) *Attorney, Agent, or Firm* — Brinks Hofer Gilson & Lione

(57) ABSTRACT

A module is described having a semiconductor chip which has at least one contact pad. A first dielectric layer, which contains a fluorocarbon compound, as well as a first wiring layer are applied to the semiconductor chip.

37 Claims, 3 Drawing Sheets

SEMICONDUCTOR MODULE WITH A DIELECTRIC LAYER INCLUDING A FLUOROCARBON COMPOUND ON A CHIP

The invention relates toga semiconductor module and to a method for production of a semiconductor module.

Wiring layers can be applied to semiconductor chips, and are used to connect contact pads on the semiconductor chips to external contact elements. The external contact elements may, for example, be arranged in predetermined patterns on the semiconductor chips. The wiring layers may be embedded in dielectric layers.

A module according to the independent claims 1 and 16, as well as a method according to the independent claims 27 and 31 are specified against this background. Advantageous developments and refinements are specified in the dependent claims.

According to one refinement, a module comprises a semiconductor chip with at least one contact pad. A first dielectric layer, which contains a fluorocarbon compound, and a first wiring layer are applied to the semiconductor chip.

According to a further refinement, a module comprises a semiconductor chip with at least one contact pad, a first dielectric layer which is applied to the semiconductor chip and has a dielectric constant of less than 3.2, and a first wiring layer which is applied to the semiconductor chip.

According to a further refinement, an encapsulation element with at least two semiconductor chips is provided. A first dielectric layer, which contains a fluorocarbon compound, and a first wiring layer are applied to the semiconductor chip.

The invention will be explained in more detail in the following text using examples and with reference to the drawings, in which.

Modules which contain semiconductor chips are described in the following text. These are not special embodiments of the semiconductor chip. For example, the semiconductor chip may be an integrated circuit in any desired form, a microprocessor or a microelectro-mechanical component. The semiconductor chip need not be manufactured from specific semiconductor material and, furthermore, may contain inorganic and/or organic materials which are not semiconductors. Furthermore, the semiconductor chip may be packaged or unpackaged.

The semiconductor chip has a contact pad which allows electrical contact to be made with the semiconductor chip. The contact pad may be composed of any desired conductive material, for example of a metal, such as aluminium, gold or copper, a metal alloy or a conductive organic material.

One or more dielectric layers are applied to the semiconductor chip. At least one of the dielectric layers may contain a fluorocarbon compound. In particular, the fluorocarbon compound may be a fluorohydrocarbon compound or a polymer containing fluorocarbon, such as polytetrafluoroethylene (PTFE). As an alternative to a fluorocarbon compound, at least one of the dielectric layers may be produced from a dielectric material which has a dielectric constant of less than 3.2, and in particular of less than 2.8, and in particular in the range from 1.8 to 2.8. The dielectric layer need not be homogeneous and need not be composed of just a single material.

Furthermore, a wiring layer is applied to the semiconductor chip and may be arranged above or below one of the dielectric layers, or between two of the dielectric layers. For example, the wiring layer may be used to make electrical contact with the semiconductor chip from outside the module. The wiring layer may be manufactured with any desired geometric shape and any desired material composition. The wiring layer, for example, may be composed of linear conductor tracks, but may also be in the form of a layer covering an area. Any desired conductive materials, such as metals, for example aluminium, gold or copper, metal alloys or organic conductors, may be used as the material. The wiring layer need not be homogeneous or manufactured from just one material, that is to say various compositions and concentrations of the materials contained in the wiring layer are possible.

Mutually corresponding components are provided with the same reference symbols in FIGS. 1 to 4, which will be described in the following text.

Figure 1:
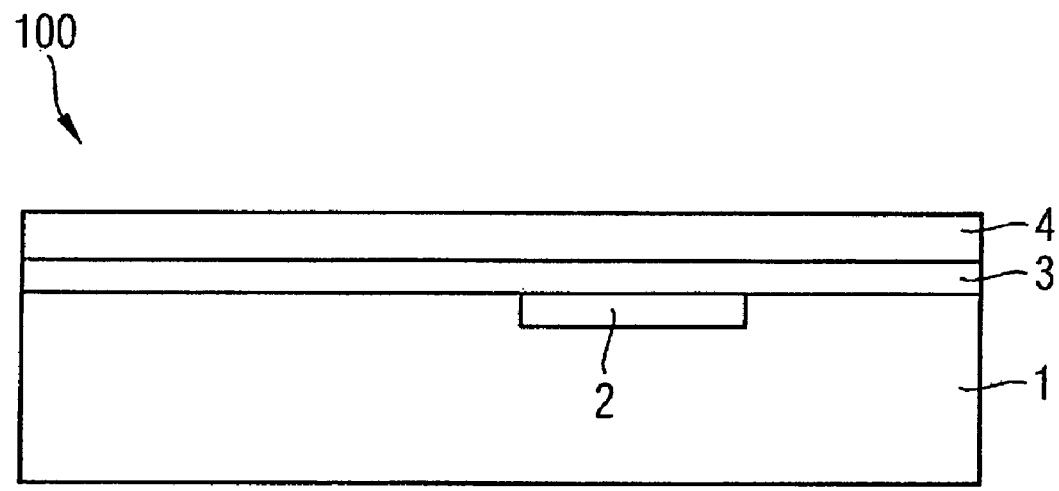
FIG. 1 shows a schematic illustration of a module 100 as one exemplary embodiment.

FIG. 1 shows a cross section through a module 100 as one exemplary embodiment. The module 100 contains a semiconductor chip 1 with a contact pad 2, which is arranged on a main surface of the semiconductor chip 1, for example on the active main surface. A: first dielectric layer 3 and a first wiring layer 4 are applied to the main surface of the semiconductor chip 1 with the contact pad 2. The dielectric layer 3 may either contain a fluorocarbon compound, for example polytetrafluoroethylene, or may be manufactured from any desired dielectric which has a dielectric constant of less than 3.2. In the case of the module 100 illustrated in FIG. 1, the dielectric layer 3 is arranged between the semiconductor chip 1 and the wiring layer 4. The dielectric layer 3 and the wiring layer 4 may alternatively also be applied to the semiconductor chip 1 in the opposite sequence.

Figure 2:
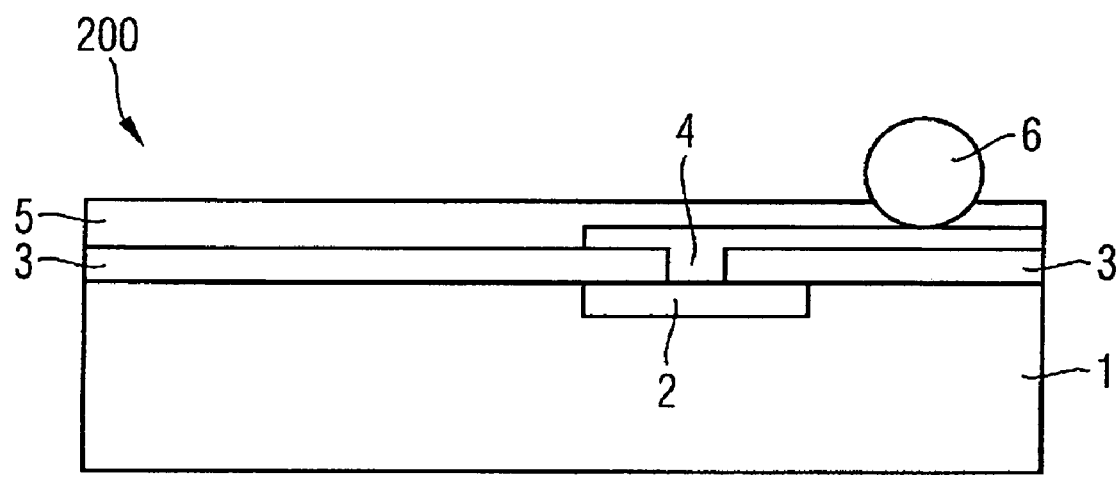
FIG. 2 shows a schematic illustration of a module 200 as a further exemplary embodiment.

FIG. 2 shows a cross section through a module 200 as a further exemplary embodiment. As in the case of the module 100, a first dielectric layer 3 and a first wiring layer 4 are applied to the semiconductor chip 1 of the module 200. In this case, once again, the dielectric layer 3 contains a fluorocarbon compound or is manufactured from some other dielectric with a dielectric constant of less than 3.2. In the case of the module 200, the wiring layer 4 has been applied to the dielectric layer 3, with an electrical contact being produced between the contact pad 2 and the wiring layer 4 at one point. The dielectric layer 3 has an opening in order to produce this contact. A second dielectric layer 5 and an external contact element 6 are applied to the wiring layer 4. The external contact element 6 has been applied to an opening in the dielectric layer 5, and is electrically connected to the wiring layer 4. The external contact element 6 may be a solder deposit, for example a solder ball. The dielectric layer 5 may contain a fluorocarbon compound, like the dielectric layer 3, or may be manufactured from any other dielectric with a dielectric constant of less than 3.2. However, the dielectric layer 5 can also be manufactured from a dielectric which neither contains a fluorocarbon compound nor has a dielectric constant of less than 3.2.

By way of example, the semiconductor chip 1 may be an integrated circuit in any desired form. The integrated circuit may be integrated in a semiconductor substrate and may contain any desired microelectronic components, such as diodes or transistors. In order to produce components such as these in a semiconductor substrate, the electrical characteristics of the semiconductor substrate are varied in specific regions, for example by doping with foreign atoms. The foreign atoms are in this case incorporated at different depths and with different concentrations in the semiconductor substrate.

After the doping of the semiconductor substrate with foreign atoms, the semiconductor substrate generally does not yet have any functionality, since the integrated components are still isolated from one another, that is to say they are not electrically connected to one another. Depending on the desired functionality of the integrated circuit to be implemented, the integrated components are therefore electrically connected to one another, for example by means of interconnects. Furthermore, certain components cannot be produced just by doping of the semiconductor substrate, but further process steps are required for their production. This applies, for example, to MOS (Metal Oxide Semiconductor) transistors, across whose drain-source path an insulating dielectric must be deposited after the doping process, with a conductive gate electrode being deposited above this. The interconnects and electrodes which are applied to the semiconductor substrate may be surrounded by a dielectric material. The chip-internal wiring layer which comprises the described interconnects and electrodes is frequently referred to in the specialist literature as an "interconnect layer". The chip-internal wiring layer is not illustrated explicitly in FIG. 2.

A passivation layer, which is applied to the chip-internal wiring layer and can be manufactured from an inorganic material, in particular from silicon nitride, is likewise not illustrated explicitly in FIG. 2. The contact pad 2 can be embedded in this passivation layer, and allows electrical contact to be made with the integrated circuit. The contact pad 2 may be composed of any desired electrically conductive material and, in particular, may be in the form of a small aluminium plate.

The semiconductor substrate may still be in the form of a wafer during the doping of the semiconductor substrate with foreign atoms and during the production of the "interconnect layer" and of the passivation layer, which is arranged above it, and the contact pads 2. The semiconductor chip 1 is split up only after this has been done, for example by sawing of the wafer.

Further contact pads can be arranged on the semiconductor chip 1, in addition to the contact pads 2 illustrated in FIGS. 1 and 2. During the production of the semiconductor chip 1, the geometric arrangement of the contact pads 2 is not necessarily matched to the geometric arrangement of the electrical contact pads of external application to which the semiconductor chip 1 is intended to be connected. For example, in order to allow the external contact elements 6 to be arranged in a specific pattern, the wiring layer 4 is required which connects the contact pads 2 to the external contact elements 6. A wiring layer with a function such as this is also referred to in the specialist literature as a "redistribution layer" or an interposer layer. The wiring layer 4 may either be applied to the wafer before it is sawn up, or to the semiconductor chip 1 which has already been split up.

In order to produce the modules 100 and 200, the dielectric layer 3 can be applied to the semiconductor chip 1 in various ways. For example, the dielectric layer 3 can be deposited from a gas phase or from a solution, or can be laminated onto the semiconductor chip 1. Furthermore, thin-film technology methods can be used for application of the dielectric layer 3. The thickness of the dielectric layer 3 can in this case be matched to its desired electromagnetic characteristics, for example its dielectric constant (k value). The dielectric layers 3 may be up to 10 µm thick.

The dielectric layer 3 is opened above the contact pads 2 in order to allow the contact pads 2 to make electrical contact with the wiring layer 4. By way of example, photolithographic methods or etching methods may be used to open the dielectric layer 3. The wiring layer 4 is then applied to the dielectric layer 3. Methods for production and structuring of a metallization layer that are known to a person skilled in the art are used for this purpose. The second dielectric layer 5 is applied to the wiring layer 4. The two dielectric layers 3 and 5 may not only have identical or similar material compositions but also different material compositions. An identical or similar material composition results in better adhesion to the contact pads between the two dielectric layers 3 and 5.

The dielectric layer 5 is opened in the areas in which the external contact elements 6 are intended to be arranged. The external contact elements 6 are then applied, for example in the form of solder deposits. The solder material may be formed from alloys which are composed, for example, from the following materials: SnPb, SnAg, SnAgCu, SnAgCuNi, AuSn, CuSn and SnBi. If solder balls are used as the external contact elements 6, the solder balls are applied, for example, by so-called "ball placement", in which pre-shaped balls composed of solder material are applied to the open points in the wiring layer 5. As an alternative to "ball placement", the solder balls may, for example, be applied by means of template printing with a solder paste, followed by a heat-treatment process, or by electrochemical plating followed by an optional heat-treatment process.

A second wiring layer can be applied to the dielectric layer 5 and, for example, is likewise used for electrical connection of contact pads 2 to external contact elements 6. The second wiring layer makes it possible, for example, for interconnects in the first wiring layer to cross interconnects in the second wiring layer. In principle, any desired number of dielectric layers and wiring layers can be applied to the semiconductor chip 1. These layers may be structured to correspond to the respectively desired functionality of the semiconductor chip 1.

Electromagnetic fields can be produced outside the wiring layer 4 by a current flow in the wiring layer 4 and these can adversely affect the operation of other components, for example as a result of crosstalk phenomena. Adverse effects such as these can be counteracted by the dielectric layers 3 and 5 which surround the wiring layer 4 having a low dielectric constant. A further advantage of the dielectric layers 3 and 5 having low dielectric constants is the reduced electrical power loss in radio-frequency applications. Furthermore, the use of dielectrics with low dielectric constants leads to a reduced capacitance, which makes it possible to reduce the thickness of the dielectric layers 3 and 5.

Dielectric layers with low dielectric constants may, for example, be produced by means of the fluorocarbon compounds described above. With a dielectric constant of about 1.8 to about 2.8, polytetrafluoroethylene is particularly suitable for use in the dielectric layers 3 and 5. In addition to the fluorocarbon compounds, the dielectric layers 3 and 5 may contain further substances, such as glass fabric.

In addition to its low dielectric constant, polytetrafluoroethylene has further advantageous characteristics, which will be explained briefly in the following text. Polytetrafluoroethylene is temperature-resistant from −190° C. to 260° C. (briefly up to 300° C.), is incombustible, is water-repellent and is virtually universally resistant to chemicals (that is to say except for molten alkaline metals and a few perfluorinated compounds, it withstands most substances, such as acids, solvents, petrol, oil etc). Furthermore, polytetrafluoroethylene is resistant to mould and bacteria growth, causes no physiological problem and is permissible for direct contact with foodstuffs. It has an anti-adhesive surface, that is to say it does not adhere, and has a low coefficient of friction. With regard to its further electrical characteristics, the material has a high electrical dielectric strength, and its surface has excellent resistance to arcs. Polytetrafluoroethylene is UV-resistant, infrared-resistant and $CO_2$-resistant, and is permeable for ultrasound and microwaves. Reinforcement of polytetrafluoroethylene with glass fabrics leads to very good tear resistance and tensile strength, low thermal expansion and good dimensional stability.

Figure 3:
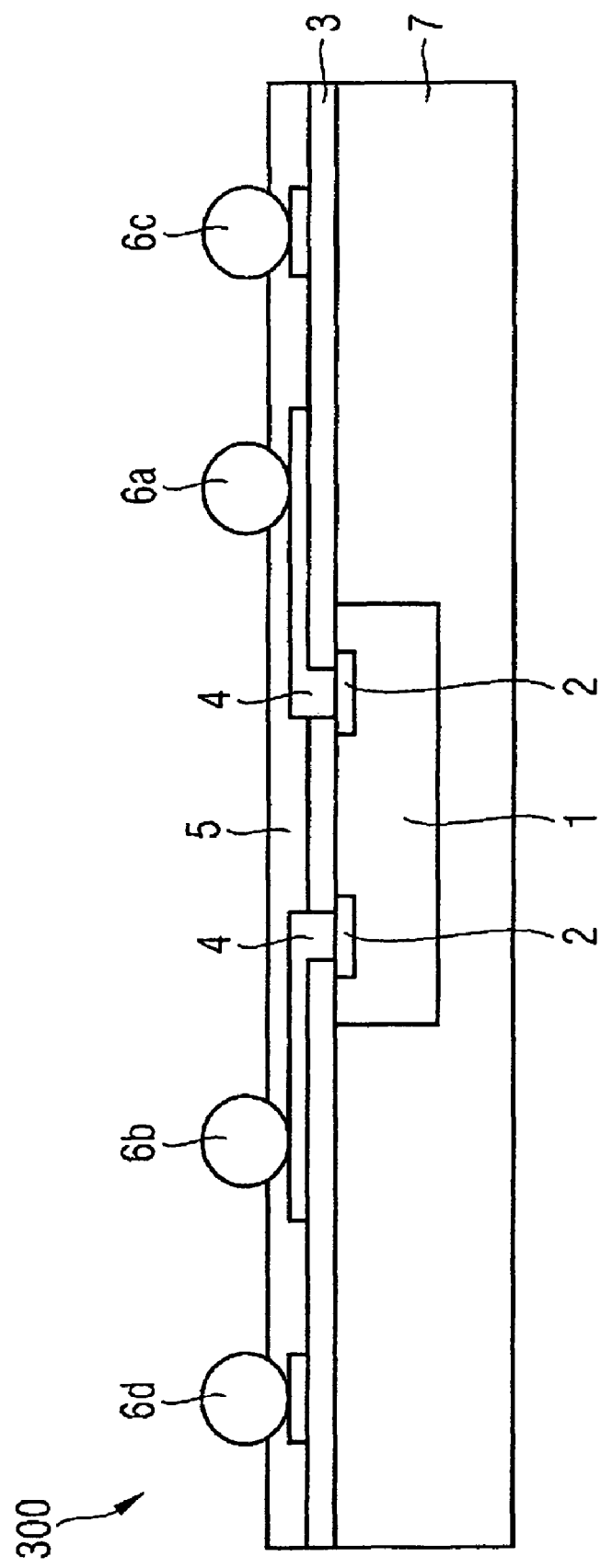
FIG. 3 shows a schematic illustration of a module 300 as a further exemplary embodiment.

As a further exemplary embodiment, FIG. 3 shows a cross section through a module 300. In contrast to the modules 100 and 200, the semiconductor chip 1 in the module 300 is surrounded by an encapsulation element 7. The semiconductor chip 1 is thus embedded in the encapsulation element 7 such that the main surface on which the wiring layer 4 and the dielectric layers 3 and 5 are arranged is not covered by the encapsulation element 7. In this case, the main surface of the semiconductor chip 1 and that of the encapsulation element 7 form a common plane, on which the wiring layer 4 and the dielectric layers 3 and 5 are deposited. The encapsulation element 7 may be produced from various materials, for example plastics, and may have different geometric shapes. In particular, the encapsulation element 7 may be in the form of a disc.

The encapsulation element 7 allows the wiring layer 4 and the dielectric layers 3 and 5 to extend beyond the semiconductor chip 1. The external contact elements 6a, 6b, 6c and 6d illustrated in FIG. 3 for the module 300 therefore do not need to be arranged in the area of the semiconductor chip 1 but can be distributed over a larger area. The contact pads 2 of the semiconductor chip 1 are connected to the external contact elements 6a to 6d by means of the wiring layer 4, and if required further wiring layers. The increased area which is available for arrangement of the external contact elements as a result of the encapsulation element 7 means that the external contact elements can not only be placed at a greater distance from one another in comparison to the modules 100 and 200, but that the maximum number of external contact elements which can be placed there is likewise increased.

Figure 4:
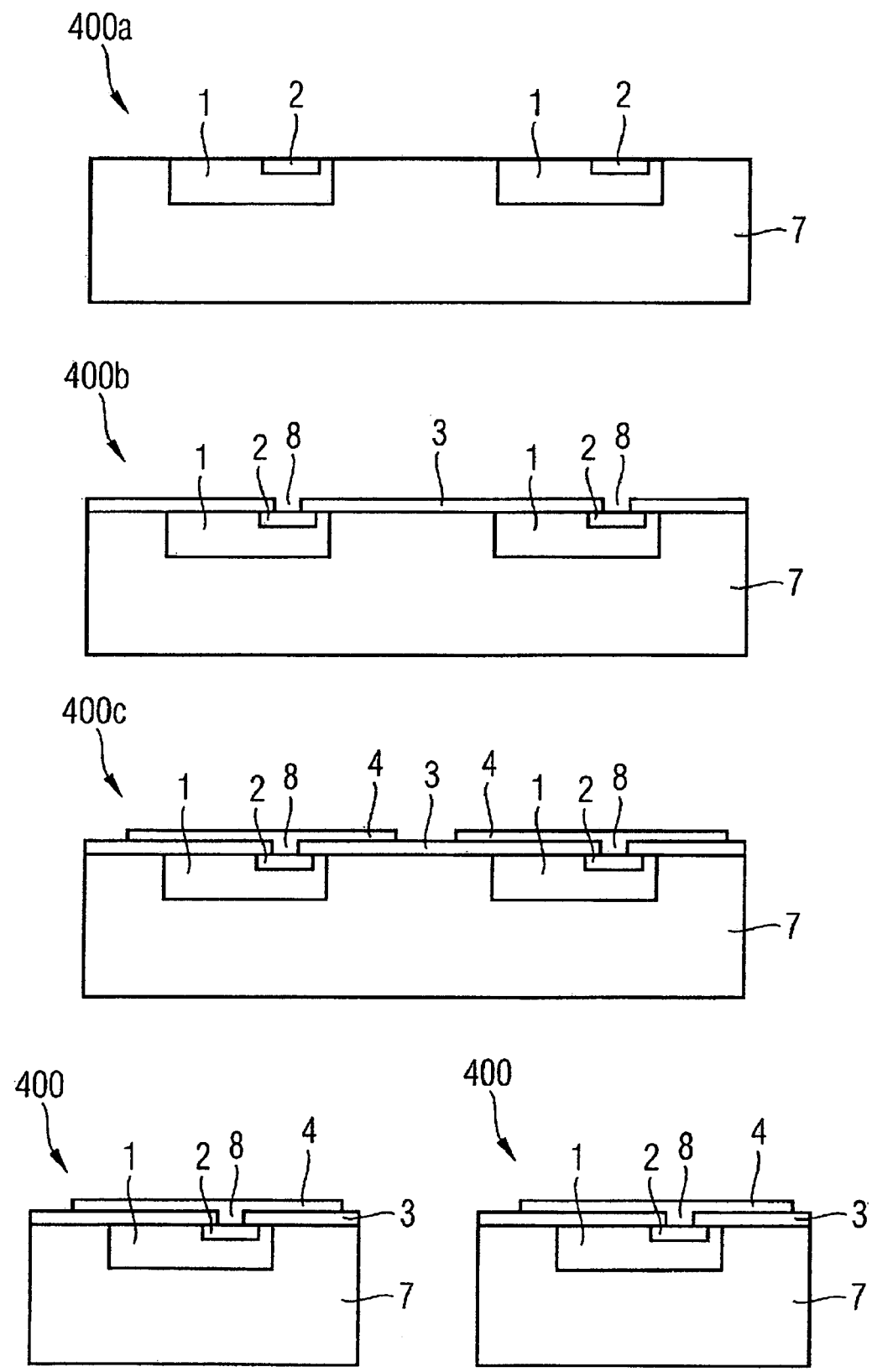
FIG. 4 shows a schematic illustration of a method for production of a module 400, as a further exemplary embodiment.

FIG. 4 shows a method for production of modules 400. In a first method step, a module 400a is produced, comprising an encapsulation element 7 and at least two semiconductor chips 1 embedded in it. Each of the semiconductor chips 1 has at least one contact pad 2. The two semiconductor chips 1 need not be physically identical, and may have different functionalities. The semiconductor chips 1 are embedded in the encapsulation element 7 such that the main surfaces of the semiconductor chips 1 are exposed, and form a plane with a main surface of the encapsulation element 7.

The module 400a, that is to say the encapsulation element 7 together with the semiconductor chips 1, is typically encapsulated to form a round shape, in the form of a disc, so that, after curing, it can be handled and processed in the process steps described in the following text by processing machines in the same way as a semiconductor wafer. The at least two semiconductor chips 1 can be embedded in the encapsulation element 7, which is in the form of a disc, in a known manner using a moulding pressing process. In this method, the active main surface of the at least two semiconductor chips 1 is placed on an adhesive film. The adhesive film together with the semiconductor chips 1 is then placed on the flat base of a first encapsulation moulding, which is open at the top and has a round rim of the same size as the wafer. A predetermined amount of viscous encapsulation material is then cast over the adhesive film and the semiconductor chips 1. A flat second moulding, of the same size as the wafer, is then pressed onto the encapsulation material, so that the encapsulation material is distributed laterally over the semiconductor chips 1 until all of the semiconductor chips 1 and the first moulding have been completely covered by the encapsulation material. This results in the encapsulation material being pressed into a mould of the same size as the wafer, which is then cured, for example by heating. When the cured encapsulation material is removed from the mould, this results in a module 400a of the same size as the wafer, in which the active main surfaces of the semiconductor chips 1 are located at the top, since they have not been wetted with encapsulation material during the encapsulation process, because they are covered by the adhesive film. It should be noted that, in this method, the thickness of the module 400a, which is in the form of a disc, is governed by the amount of encapsulation material in the first mould. The thickness of the module 400a is typically in the range from 400 μm to 1000 μm.

In a further method step, a dielectric layer 3 is applied to the module 400a, covering both the two semiconductor chips 1 and the encapsulation element 7. The dielectric layer 3 contains a fluorocarbon compound, or is composed of some other dielectric with a dielectric constant of less than 3.2. The dielectric layer 3 is then structured, for example by means of standard photolithographic processing steps, in order to produce openings 8 to the contact pads 2.

The dielectric layer 3 may, for example, be a fluoropolymer layer which is deposited by means of a CVD (Chemical Vapour Deposition) process on the module 400a. The CVD process results in plasma polymerization on the surface of the module 400a. The CVD process may take place, for example, in a parallel-plate reactor using $CHF_3$ as the process gas. During this process, the plasma is produced in the parallel-plate reactor using a low-pressure method, by injection of the power from an RF (Radio-Frequency) generator. The power from the RF generator may in this case be up to 600 W at a frequency of 13.56 MHz. Desired layer characteristics and a desired layer thickness can be achieved by optimization of the parameters which govern the process, such as the gas composition, gas pressure, gas flow rate and plasma power. The chemical composition of the deposited dielectric layer 3 can be determined by means of X-ray and photo-electron spectroscopy. In the described example $CHF_3$ bonds are predominantly detected, which are preferably produced with a low plasma energy power and a low deposition rate. In addition to $CHF_3$ as the process gas, it is also possible to use, for example, $CF_4$ and $O_2$ or mixtures of these in the plasma chamber. If $CF_4$ is used, the fluorine component of the deposited polymer layer can be increased, while the use of $O_2$ allows the deposited dielectric layer 3 more polar and therefore more adhesive. The thickness of the dielectric layer 3 can be varied by controlling the process parameters, such as the gas concentration and plasma power, the deposition rate and the deposition time. In this case, the thickness of the dielectric layer 3 may be from a few hundred nanometres up to about 20 μm.

A wiring layer 4 is then applied to the dielectric layer 3 of the module 400b. This is done, for example, by means of metallization followed by structuring of the metallization layer. The electrical lines which are in each case formed from the structured metallization layer are connected through the openings 8 to the corresponding electrical contacts 2 on the semiconductor chips 1. The wiring layer 4 may have identical characteristics to those of the wiring layers 4 which have already been described in FIGS. 1 to 3. After the structuring that has been mentioned, the wiring layer 4 may be in the form of interconnects. The thickness of the interconnects, that is to say the thickness of the wiring layer 4, is in this case typically in the range from 3 μm to 10 μm. In practice, the interconnects have a width of at least 10 µm, with width limits in the direction of higher values not being processing-relevant, but only of a geometric nature.

After the structuring of the wiring layer 4, the two semiconductor chips 1 are separated from one another by separation of the encapsulation element 7, for example by sawing. The two modules 400 obtained from the module 400c may be configured in precisely the same way as the module 300 illustrated in FIG. 3.

It is obvious to a person skilled in the art that the production process illustrated in FIGS. 4a to 4c is intended to be only of an exemplary nature, and many variations are possible. For example, the method can be developed by the application and structuring of further wiring layers 4, which are each separated from one another by a dielectric layer 3. A large number of wiring levels makes it possible to drive a large number of input/output chip connections via external contact connections, which may be arranged not only in the area of the semiconductor chips 1 but also in the area of the encapsulation element 7.

The invention claimed is:

1. A semiconductor module comprising:
   a semiconductor chip comprising at least one contact pad;
   a first dielectric layer which is applied to the semiconductor chip and comprises a fluorocarbon compound reinforced with a glass fabric and a thickness of less than or equal to 9.0 µm; and
   a first wiring layer which is applied to the semiconductor chip.

2. The semiconductor module of claim 1, where the first wiring layer is applied to the first dielectric layer.

3. The semiconductor module of claim 1, where the first wiring layer is electrically connected to the at least one contact pad.

4. The semiconductor module of claim 1, further comprising a second dielectric layer, where the second dielectric layer is applied to the first wiring layer.

5. The semiconductor module of claim 4, where the second dielectric layer comprises a fluorocarbon compound.

6. The semiconductor module of claim 4, further comprising a second wiring layer, where the second wiring layer is applied to the second dielectric layer.

7. The semiconductor module of claim 1, where the fluorocarbon compound is at least one of a fluorohydrocarbon compound or a polymer.

8. The semiconductor module of claim 1, where the fluorocarbon compound comprises a dielectric constant of approximately less than 3.2.

9. The semiconductor module of claim 8, where the fluorocarbon compound comprises a dielectric constant approximately between 1.8 and 2.8.

10. The semiconductor module of claim 1, where the semiconductor chip is surrounded by an encapsulation element.

11. The semiconductor module of claim 10, where at least one of the first dielectric layer and the first wiring layer are applied to the encapsulation element.

12. The semiconductor module of claim 10, where the encapsulation element forms of a disc.

13. The semiconductor module of claim 1, where the semiconductor chip comprises a passivation layer.

14. The semiconductor module of claim 13, where the passivation layer comprises an inorganic material.

15. The semiconductor module of claim 14, where the inorganic material is a silicon nitride.

16. The semiconductor module of claim 1, where the first wiring layer connects the at least one contact pad to at least one external contact element.

17. The semiconductor module of claim 1, where the fluorocarbon compound is polytetrafluoroethylene.

18. A semiconductor module comprising:
    a semiconductor chip comprising at least one contact pad;
    a first dielectric layer which is applied to the semiconductor chip and has a dielectric constant of approximately less than 3.2 and a thickness of less than or equal to 9.0 µm;
    a first wiring layer which is applied to the semiconductor chip; and
    a second dielectric layer applied to the first wiring layer and comprising a fluorocarbon compound.

19. The semiconductor module of claim 18, the first dielectric layer comprising a dielectric constant of approximately less than 2.8.

20. The semiconductor module of claim 18, where the first wiring layer is applied to the first dielectric layer.

21. The semiconductor module of claim 18, where the first wiring layer is electrically connected to the at least one contact pad.

22. The semiconductor module of claim 18, where the second dielectric layer comprises a dielectric constant of less than 3.2.

23. The semiconductor module of claim 18, further comprising a second wiring layer, the second wiring layer being applied to the second dielectric layer.

24. The semiconductor module of claim 23, where at least one of the second dielectric layer and the second wiring layer are applied to the encapsulation element.

25. The semiconductor module of claim 18, where the semiconductor chip is surrounded by an encapsulation element.

26. The semiconductor module of claim 25, where at least one of the first dielectric layer and the first wiring layer are applied to the encapsulation element.

27. The semiconductor module of claim 18, where the semiconductor chip further comprises a passivation layer.

28. The semiconductor module of claim 27, where the passivation layer comprises an inorganic material.

29. A method of manufacture of a semiconductor module comprising:
    producing a semiconductor chip with at least one contact pad;
    applying with a thickness of less than or equal to 9.0 µm a first dielectric layer comprising a fluorocarbon compound reinforced with a glass fabric to the semiconductor chip; and
    applying a first wiring layer to the semiconductor chip.

30. The method of claim 29, further comprising applying a second dielectric layer to the first wiring layer.

31. The method of claim 30, further comprising applying a second wiring layer to the second dielectric layer.

32. The method of claim 30, where the second dielectric layer comprises a fluorocarbon compound.

33. A method of manufacture of a semiconductor module comprising:
   producing an encapsulation element with at least two semiconductor chips;
   applying a first dielectric layer with a thickness of less than or equal to 9.0 μm and comprising a fluorocarbon compound to the encapsulation element; and
   applying a first wiring layer to the first dielectric layer.

34. The method of claim 33, further comprising applying a second dielectric layer to the first wiring layer.

35. The method of claim 34, further comprising applying a second wiring layer to the second dielectric layer.

36. The method of claim 34, where the second dielectric layer comprises a fluorocarbon compound.

37. The method of claim 33, wherein the first dielectric applied to the encapsulation element comprises a fluorocarbon compound reinforced with a glass fabric.

* * * * *